(12) United States Patent
Dounaev et al.

(10) Patent No.: US 7,903,765 B2
(45) Date of Patent: Mar. 8, 2011

(54) METHOD FOR DEMODULATING THE SIGNAL OF MULTIPLE-POSITION FREQUENCY MANIPULATION WITH EQUIDISTANT FREQUENCY SPREADING, DEMODULATOR FOR THIS SIGNAL, AND COMPUTER-READABLE MEDIUM

(75) Inventors: Igor Borisovich Dounaev, Himki (RU); Alexander Vladimirovich Grigoriev, Gomel (BY); Leonid Alexeevich Letunov, Gomel (BY)

(73) Assignee: Igor Borisovich Dounaev, Khimki, Moscow District (RU)

( * ) Notice: Subject to any disclaimer, the term of this patent is extended or adjusted under 35 U.S.C. 154(b) by 628 days.

(21) Appl. No.: 11/957,535

(22) Filed: Dec. 17, 2007

(65) Prior Publication Data
US 2009/0022248 A1    Jan. 22, 2009

Related U.S. Application Data

(63) Continuation of application No. PCT/RU2006/000260, filed on May 24, 2006.

(30) Foreign Application Priority Data

Jun. 15, 2005    (RU) .............................. 2005118508

(51) Int. Cl.
*H04L 27/06*    (2006.01)
(52) U.S. Cl. .................................... 375/340
(58) Field of Classification Search ................. 375/140, 375/147, 260–261, 271, 316, 322, 340
See application file for complete search history.

(56) References Cited

U.S. PATENT DOCUMENTS 4,518,922 A    5/1985    Luecke
(Continued)

FOREIGN PATENT DOCUMENTS

EP    1217724 A1    6/2002
(Continued)

OTHER PUBLICATIONS

International Search Report from International Application No. PCT/RU2006/000260, mailed Oct. 19, 2006.
(Continued)

*Primary Examiner* — Khanh C Tran
(74) *Attorney, Agent, or Firm* — Houston Eliseeva LLP.

(57) ABSTRACT

This invention relates to signal transmitting engineering. The use of the inventive method demodulation of a signal of multiple position frequency manipulation with equidistant frequency spreading allows to reduce the threshold of demodulation and to ensure a quality of demodulation, which is at least identical to that of a quasi-optimal demodulator. To obtain such a result, a frequency grid is formed with a possibility of precise tuning of frequency spreading; during the reception, values having a maximum module of reception signal are extracted at all frequencies switchable values at clock frequency, this clock frequency is extracted from maximum of the received signals and is used for a precise tuning of the frequency spreading; a grid of tunable frequency is tuned with a precisely tuned frequency spreading for exact values of a frequency of received signal, and demodulation is effected by the way of coherent reception of the received signal, using only one from quadrature signals to decide whether a signal of a determined frequency is absent or present among the mentioned exact values of frequency.

10 Claims, 5 Drawing Sheets

U.S. PATENT DOCUMENTS

| | | | |
|---|---|---|---|
| 5,872,812 A | 2/1999 | Saito et al. | |
| 6,265,948 B1 * | 7/2001 | Stevenson | 332/101 |
| 6,282,168 B1 | 8/2001 | Vijayan et al. | |
| 6,288,618 B1 * | 9/2001 | Stevenson et al. | 332/101 |
| 6,671,333 B1 | 12/2003 | Lucioni | |
| 6,674,812 B1 * | 1/2004 | Stevenson | 375/302 |
| 6,697,440 B1 | 2/2004 | Shiraishi et al. | |
| 6,717,462 B2 | 4/2004 | Loheit et al. | |
| 6,727,772 B2 | 4/2004 | Kravtsov | |
| 2004/0190663 A1 | 9/2004 | Carsello et al. | |

FOREIGN PATENT DOCUMENTS

| | | |
|---|---|---|
| JP | 2000032072 | 1/2000 |
| JP | 2001237908 | 8/2001 |
| RU | 2136115 C1 | 8/1999 |
| RU | 2141730 C1 | 11/1999 |
| RU | 2232479 C2 | 7/2004 |

OTHER PUBLICATIONS

Clover-II Waveform & Protocol. HAL Communications Corporation. Engineering Document E2006 Rev A. Dec. 17, 1997.

English translation of International Preliminary Report on Patentability, dated Apr. 15, 2008, from International Application No. PCT/RU2006/000260, filed May 24, 2006.

* cited by examiner

METHOD FOR DEMODULATING THE SIGNAL OF MULTIPLE-POSITION FREQUENCY MANIPULATION WITH EQUIDISTANT FREQUENCY SPREADING, DEMODULATOR FOR THIS SIGNAL, AND COMPUTER-READABLE MEDIUM

RELATED APPLICATIONS

This application is a Continuation of PCT application serial number PCT/RU2006/000260 filed on May 24, 2006, which in turn claims priority to Russian Patent Application No. RU 2005118508 filed on Jun. 15, 2005, both of which are incorporated herein by reference in its entirety.

BACKGROUND OF THE INVENTION

This invention relates to the signal transmission technique. Particularly, this invention relates to the method for demodulating the signal of multiple frequency manipulation with equidistant frequency spreading, respective demodulator, and computer-readable medium with the program for implementing this method.

At present, various devices for demodulating the signal of multiple frequency manipulation with equidistant frequency spreading used in the transmission technique are well known.

Thus, the U.S. Pat. No. 6,671,333 (published Dec. 30, 2003) discloses, particularly, the demodulator for such a signal, being, in fact, a usual frequency detector (demodulator) that has a very significant demodulation threshold.

From the RU Patent No. 2232479 (published Jul. 10, 2004) the Method and system for transmitting and receiving the signals of multiple frequency manipulation with equidistant frequency spreading are known. However, these method and system are characterized by an increased complexity because, while receiving, they require an additional step of forming the signal peaks indicating the borders of every symbol.

The U.S. Pat. No. 6,697,440 (published Feb. 24, 2004) also discloses the demodulator of the signal of interest.

The most often used at present is the quasi-optimal demodulator. For example, the U.S. Pat. No. 4,518,922 (published May 21, 1985) discloses the demodulator for the signal of multiple frequency manipulation with equidistant frequency spreading, which demodulator comprising m quadrature channels, where m is the maximum number of quadrature frequencies in the signal of multiple frequency manipulation with the equidistant frequency spreading, every quadrature channel comprising the first and second multipliers, which outputs being connected with the inputs of the first and second low-pass filters, respectively, the first inputs of all multipliers of all quadrature channels being the united input of the demodulator, in every quadrature channel the second input of the first multiplier is connected with the output of the phase shifter by 90°, which input is united with the second input of the second multiplier and is the reference input of this quadrature channel; the frequency former, which each of m outputs is connected to the reference input of the respective quadrature channel; the decision unit which outputs are the demodulator outputs.

The same U.S. Pat. No. 4,518,922 disclose also the method for demodulating the signal of multiple frequency manipulation with equidistant frequency spreading, which method comprises the steps of: forming the array of adjustable frequencies from $f_1$ to $f_m$, where m is the maximum number of the frequencies in the signal of multiple frequency manipulation with equidistant frequency spreading $f_p=kf_t$, where $f_t$ is the clock frequency, k=1, 2, ..., the initial frequency values in said array being allocated approximately in those regions, where the exact values of the frequency of the received signal could be situated; demodulating the received signal using said formed frequency array.

However, the known quasi-optimal demodulator still has the demodulation threshold that is 3 dB higher than the optimal one.

SUMMARY OF THE INVENTION

So, there is a necessity for developing such a method for demodulating the signal of multiple frequency manipulation with equidistant frequency spreading, as well as the respective demodulator, that would permit to decrease the demodulation threshold while providing at least the same demodulation quality as in the quasi-optimal demodulator.

In order for solve this problem in the method for demodulating the signal of multiple frequency manipulation (FMn) with equidistant frequency spreading, which method comprises the steps of: forming the array of adjustable frequencies from $f_1$ to $f_m$, where m is the maximum number of the frequencies in the signal of multiple frequency manipulation with equidistant frequency spreading $f_p=kf_t$, where $f_t$ is the clock frequency, k=1, 2, ..., the initial frequency values in said array being allocated approximately in those regions, where the exact values of the frequency of the received signal could be situated; demodulating the received signal using said formed frequency array, in accordance with the present invention, the step of forming the frequency array is performed for configuring the frequency array for exact adjusting the frequency spreading; and the method further comprising steps of: extracting, while receiving, the maximum values in modulus of the received signal on all frequencies $f_i$ (i=1, ..., m) switched with the clock frequency $f_t$; extracting the clock frequency $f_t$ from the switched maximum values of the received signal and using thereof for adjusting exactly the frequency spreading $f_p$ to coincide therewith; performing the step of tuning the array of adjustable frequencies with the frequency spreading adjusted accurately to the exact values of the received signal frequency; whereupon, just performing the step of demodulating by means of receiving coherently the received signal using only one of the quadrature channels for making the decision on the presence or absence of signal with the particular frequency from amongst said exact frequency values.

An additional distinction of the method according to the present invention consists in that, for extracting the maximum values in modulus of the received signal, the amplitude value of every one of quadrature components of any frequency is raised to the square, the squared amplitude values in every pair of the quadrature components of one frequency are summed, and the square root is taken of every determined sum.

One more distinction of the method according to the present invention consists in that the step of adjusting the frequency spreading to coincide with the clock frequency extracted from the received signal is performed using the first frequency phase-locked-loop.

In so doing, the step of tuning the array of adjustable frequencies with the frequency spreading adjusted accurately to the exact values of the received signal frequency is performed using the second frequency phase-locked-loop.

In order for solving the same problem, the demodulator for the signal of multiple frequency manipulation (FMn) with equidistant frequency spreading, which demodulator comprising: m quadrature channels, where m is the maximum number of quadrature frequencies in the signal of multiple frequency manipulation with the equidistant frequency spreading; a frequency former, which each of m outputs is connected to the reference input of the respective quadrature channel; a decision unit intended for making the decision on the presence or absence of the signal with the particular frequency in said signal of multiple frequency manipulation, the outputs of said decision unit are the demodulator outputs, in accordance with the present invention, further comprises: m value in modulus calculators, which information inputs are the united input of the demodulator; a maximum in modulus selection unit, which every input being connected to the output of respective value in modulus calculator; a first and second commutators, which control inputs are connected to the first output of said maximum in modulus selection unit, and which outputs are connected to the first and second inputs of said frequency former; a clock-frequency discriminator, which input is connected to the second output of said maximum in modulus selection unit, and which output is connected to the third input of said frequency former; the first output of each quadrature channel is connected to the first input of the respective value in modulus calculator and respective information input of the first commutator; the second output of each quadrature channel is connected to the second input of the respective value in modulus calculator, respective information input of the second commutator, and respective input of the decision unit; said frequency former being configured for forming an array of m frequencies adjusted according to the output signals from said commutators, with the equidistant frequency spreading adjusted according to the output signal of said clock frequency discriminator, the first to m-th outputs of the frequency former being connected to the reference inputs of the first to m-th quadrature channels, respectively.

An additional distinction of the demodulator according to the present invention consists in that each quadrature channel comprises a first and second multipliers, which outputs are connected to the inputs of the first and second low-frequency filters, which outputs are the first and second outputs of the quadrature channel, respectively, the inputs of the first and second multipliers are united and is the information input of the quadrature channel, the second input of the first multiplier is connected with the output of phase shifter by 90°, which input is united with the second input of the second multiplier and is the reference input of the quadrature channel.

One more distinction of the demodulator according to the present invention consists in that the value in modulus calculator comprises a first and second squaring units, summer and square root extracting unit, which output is the calculator output, the inputs of the first and second squaring units are the first and second calculator inputs, respectively, the outputs of both squaring units are connected to the inputs of the summer, which output is connected to the input of the square root extracting unit.

One more distinction of the demodulator according to the present invention consists in that the frequency former comprises a first and second adjustable generators, a first and second loop filters, a first to (m−1)-th frequency shift units, phase detector, frequency detector, and summer, which first input is the first input of the frequency former and the output is connected through the first loop filter to the control input of the first adjustable generator, which output is connected to the signal input of the first frequency shift unit and is the first output of the frequency former, the output of each j-th (j=1, ..., m−2) frequency shift unit is connected to the signal input of the (j+1)-th frequency shift unit and is the (j+1)-th output of the frequency former, the output of the (m−1)-th frequency shift unit is the m-th output of the frequency former, the input of the frequency detector is connected to the second input of the summer, the first input of the phase detector is the third input of the frequency former, the output of the phase detector is connected through the second loop filter to the control input of the second adjustable generator, which output is connected to the control inputs of the first to (m−1)-th frequency shift units and second input of the phase detector.

In so doing, the frequency shift unit could be implemented in the form of single-sideband modulator.

Moreover, in accordance with the present invention, proposed is a computer-readable medium intended for the direct operation as a part of the computer and comprising a program for implementing the method for demodulating the signal of multiple FMn with equidistant frequency spreading according to the present invention.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The following detailed description is illustrated with drawings, in which the identical or similar elements have the same numerals.

DETAILED DESCRIPTION OF THE PREFERRED EMBODIMENTS

Figure 1:
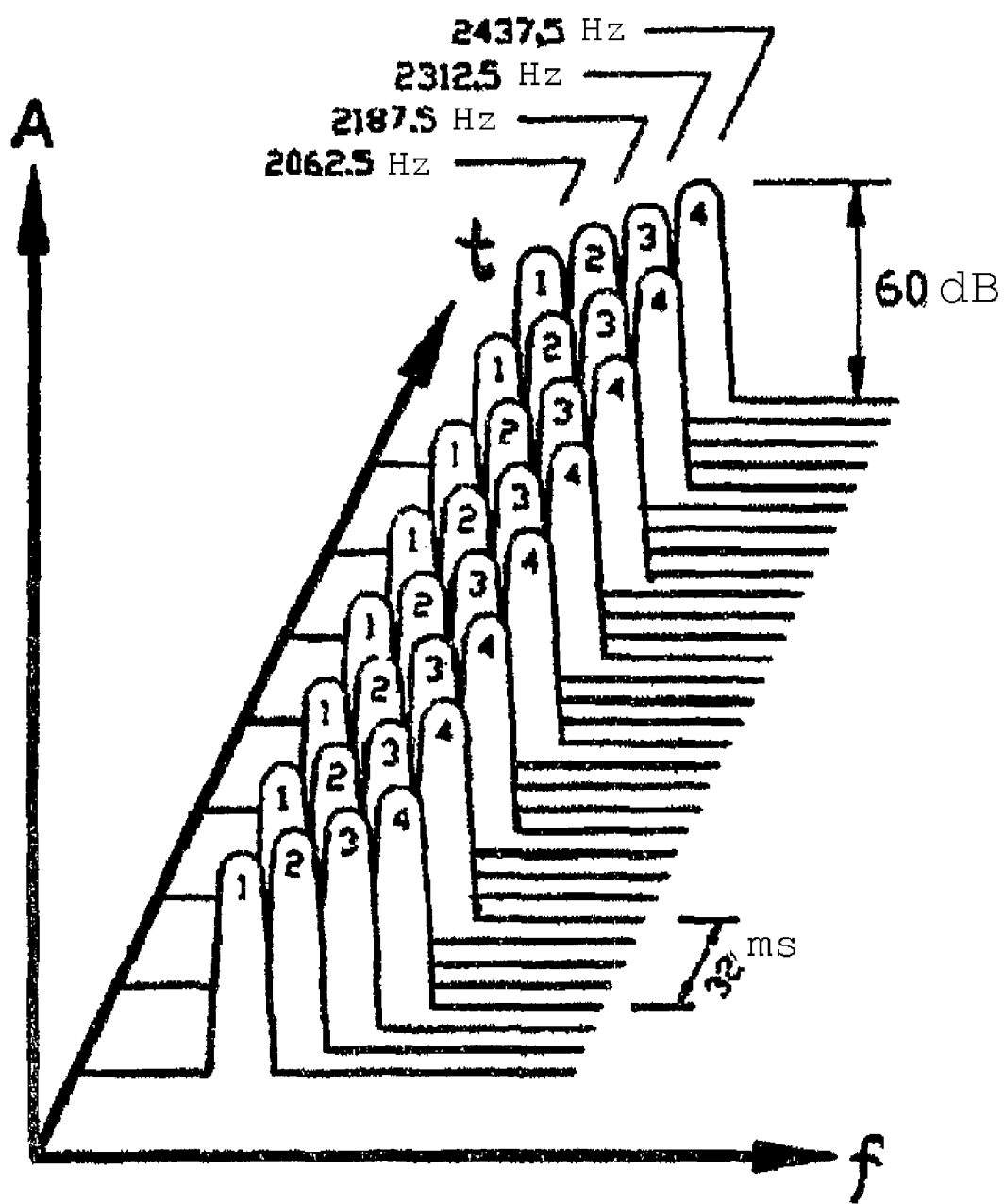
FIG. 1 illustrates the principle of the multiple-position frequency manipulation with equidistant frequency spreading based on the signal "Clover-II".

Multiple-position frequency manipulation (FMn) with equidistant frequency spreading is used in the signal transmission technique. The transmitted signal modulated by the multiple-position frequency manipulation with equidistant frequency spreading is a signal, which frequency can take any value from m predetermined frequencies having an equidistant spreading along the frequency axis (FIG. 1). This is the signal "Clover-II" developed by the HAL Communications Corporation in the beginning of 90-th years of the XX century. Based on this signal, a class of modem techniques for demodulation developed especially for radio-frequency radio-systems and used in modem products of this company, such as PCI-4000, P-38 and DSP-4100, is constructed (Clover-II Waveform & Protocol. HAL Communications Corporation. Engineering Document E2006 Rev A. Dec. 17, 1997). As could be seen from FIG. 1, such a signal represents pulses having the repetition period of 32 ms on each of four carrier frequencies with the spreading of 125 Hz between neighbor frequencies. The pulses are transmitted in series with the interval of 8 ms one on each frequency, after which the cycle is repeated. The data are presented by the phase or amplitude variation in relation to the previous pulse on this frequency. Of course, other known forms of FM signals could be used (see the US Patent Application No. 2004/0190663, publ. Sep. 30, 2004).

A specific value of frequency $f_i$ (where i=1, 2, ..., m) at the interval T of one information symbol transmission is selected in accordance with the value of the symbol being transmitted. The spreading $f_p$ of two neighbor frequency in such a signal is a multiple of the clock frequency $f_t$, i.e., $f_p = kf_t$, where k=1, 2, ... (particularly, when k=1, the spreading $f_p$ is equal to the clock frequency $f_t$). In this case, the signal being transmitted has no phase discontinuities at any k.

In the existing demodulators using a conventional frequency detector for demodulating the FMn signal with equidistant frequency spreading (e.g., as in the mentioned U.S. Pat. No. 6,671,333), the threshold ratio of signal power to noise power (SNR) is very great.

In the case of quasi-optimal demodulator for the FMn signal with equidistant frequency spreading (e.g., as in the mentioned U.S. Pat. No. 4,518,922), this threshold ratio SNR is significantly (by 3 dB) lesser.

In general, the multiple-position FMn signal with equidistant frequency spreading forms a system of the orthogonal functions:

$$S_1(t), S_2(t), \ldots, S_i(t), \ldots, S_m(t),$$

where $$S_i \cdot S_j = \int_0^T S_i(t) \cdot S_j(t) \cdot dt = 0 (S_i \neq S_j).$$

All signals $S_i$ have the same energy, i.e.:

$$|S_i|^2 = \int_0^T S_i^2(t) \cdot dt = E_S = const.$$

The equation (1) is the definition of the orthogonality property and suggests the optimal technique for receiving the orthogonal signals. This technique consists in forming and comparing subsequently scalar products with each other:

$$y_i = \int_0^T x(t) \cdot S_i(t) \cdot dt = b_i + n_i,$$

where x is an input (received) signal, y is a result of multiplying the received signal by the signal of the specific (i-th) frequency generator, b is the information component, n is the noise component.

Thus, the quasi-optimal scheme should comprise m respective converters and a decision unit intended for comparing values $b_i$ and $n_i$ with each other for every i-th frequency value. I.e., the problem is in detecting the signals in i-th proper frequency domain or, in other words, in repeating m times the detection step.

Figure 2:
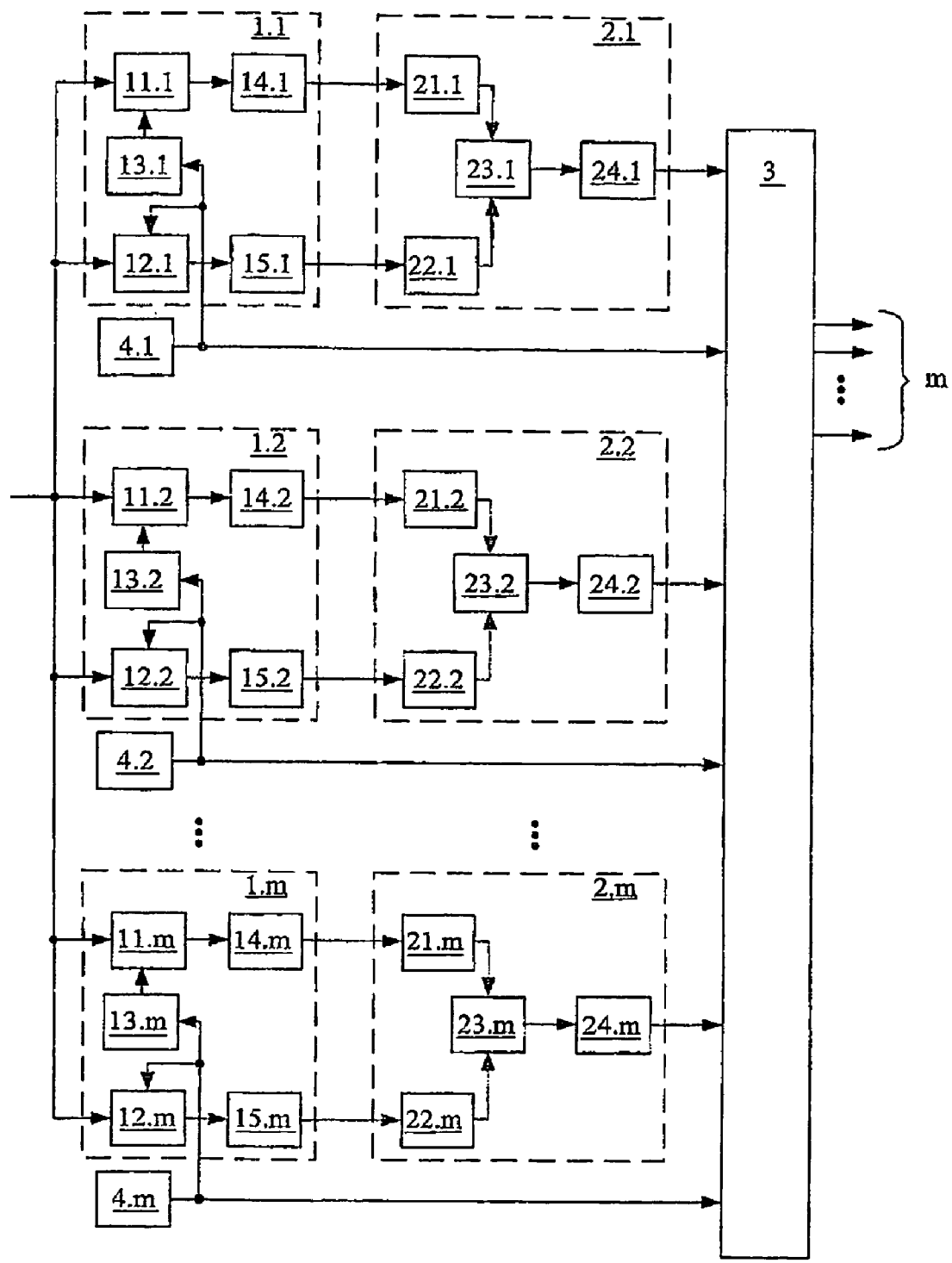
FIG. 2 represents the block diagram of the demodulator of the known quasi-optimal receiver for demodulating the signal of multiple-position FMn with equidistant frequency spreading.

The known quasi-optimal demodulator is built in accordance with the block diagram of FIG. 2. This demodulator comprises m quadrature channels 1, where m is equal to the number of components in the spectrum of the FMn signal with equidistant frequency spreading (FIG. 1), m value in modulus calculators 2, decision unit 3, and m reference frequency generators 4.

Each of the quadrature channels 1 comprises a first and second multipliers 11 and 12, to which information inputs is fed the signal being received. Hereinafter, the signal being received is assumed to be amplified, filtered and down-converted to the intermediate frequency in advance, as is well known in the background. From respective reference frequency generator 4.i (i=1, 2, ..., m) in the i-th quadrature channel, the waveforms are fed, directly and through a phase shifter 13.i by 90°, to the reference inputs of the multipliers 11.i and 12.i, respectively. Every one of generators 4 is tuned the frequency $f_i$ situated at the respective i-th position in the spectrum of the signal being transmitted (see FIG. 1). A first low-pass filter (LPF) 14 and second LPF 15 are connected to the outputs of the first and second multipliers 11 and 12, respectively, in every quadrature channel 1.

Outputs of the first and second LPF 14.i and 15.i being the output of the i-th quadrature channel 1.i are connected to the first and second inputs of the i-th value in modulus calculator 2.i. Any of the value in modulus calculator 2 can be made according to the conventional scheme from a first and second squaring units 21 and 22, summer 23 and square root extracting unit 24. In so doing, the inputs of the squaring units 21 and 22 are the inputs of the value in modulus calculator 2, and outputs of each of squaring units 21 and 22 are connected to the inputs of the summer 23, which output is connected through the square root extracting unit 24 to the output of the value in modulus calculator 2.

Outputs of the value in modulus calculators 2 in every quadrature channel 1 are connected to the respective input of the decision unit 3. This decision unit 3 can be made in the form of m level meter for comparing a signal in the respective channel with the predetermined level and for making a decision on the basis of this comparison.

Figure 3:
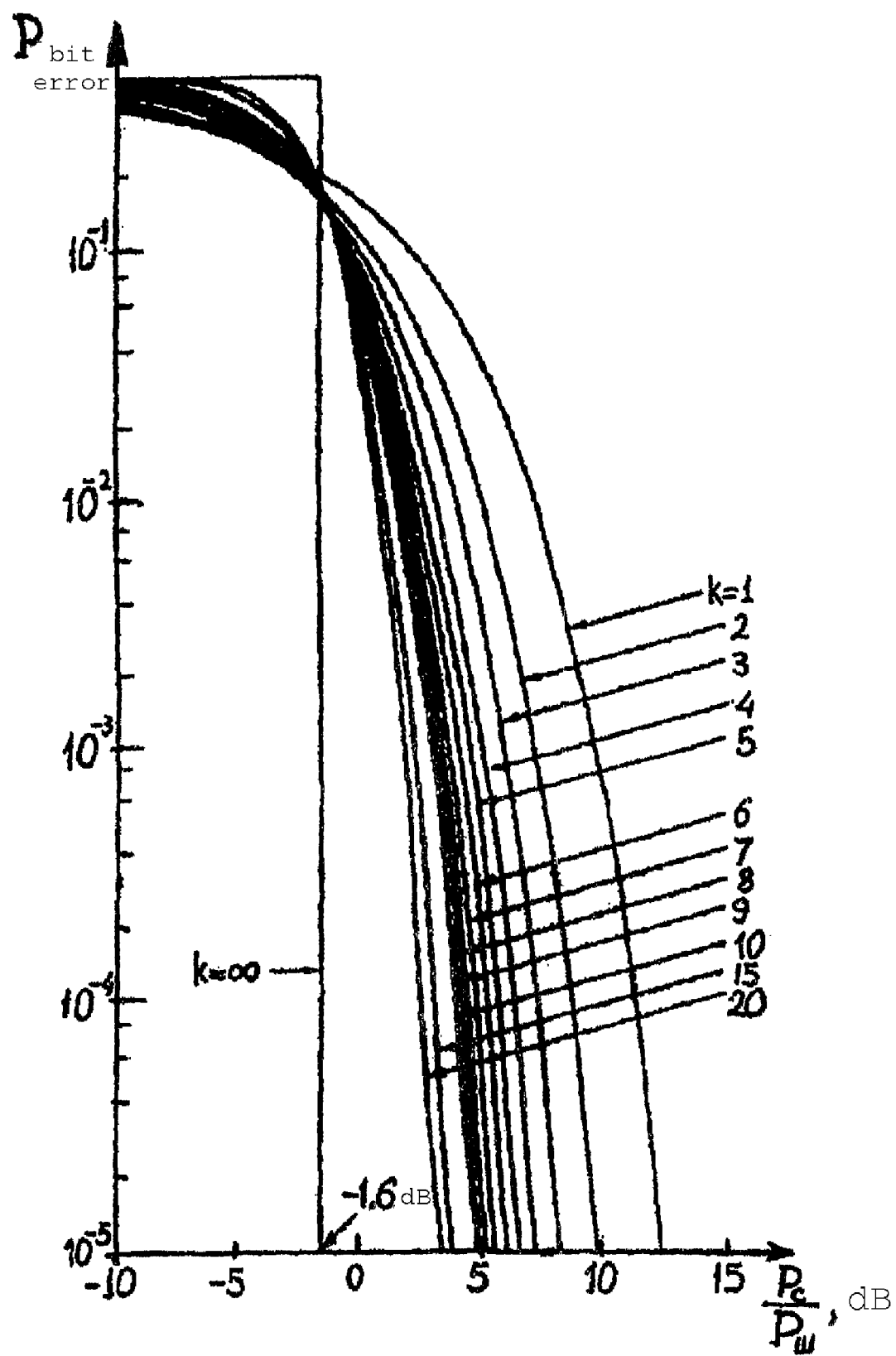
FIG. 3 shows curves of bit error probability for the coherent demodulation of the multiple-position FMn with equidistant frequency spreading in the Gauss channel depending on the ratio of signal power to noise power.

The signal being transmitted carrying the multiple-position FMn does not contain quadrature components. However, in the quasi-optimal reception, the necessity in the quadrature components still occurs because of fuzzy equality of the frequencies $f_i$ in the signal being received with the frequencies of the respective generators 4.i. Just hereupon, in the quasi-optimal reception, the threshold ratio SNR deteriorates by 3 dB in comparison with the theoretically known optimal reception, as shown in FIG. 3. In this drawing, the dependencies of the bit error probability $P_{BIT\_ER}$ on the signal-to-noise ratio (SNR) are shown for modulation types with various multiplicity k. Implementation of the coherent optimal demodulator could be achieved, if only one component of the quadrature channel is used during the demodulation. But to this end, it is necessary to ensure that the frequency of each of reference frequency generators 4 is equal exactly to the respective frequency position of the signal being received within the accuracy of the phase. The demodulator proposed in the present invention ensures such a frequency adjustment and subsequent optimal demodulation of the signal of multiple-position manipulation with equidistant frequency spreading.

Figure 4:
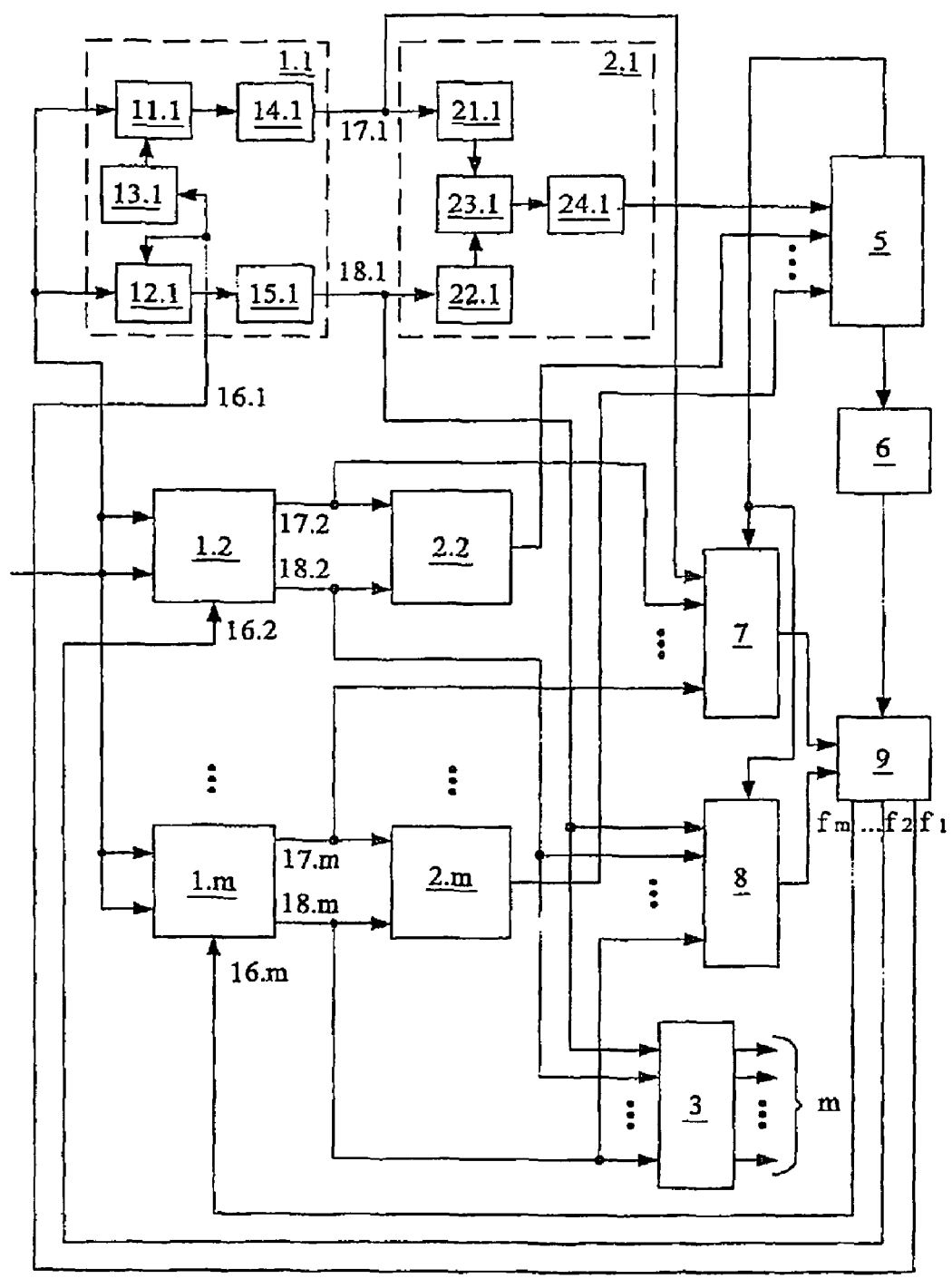
FIG. 4 is the block diagram of the demodulator of the known quasi-optimal receiver for demodulating the signal of multiple-position frequency manipulation with equidistant frequency spreading according to the present invention.

FIG. 4 depicts the block diagram of such a demodulator according to the present invention.

This demodulator, as in the case of the quasi-optimal demodulation, comprises m quadrature channels 1, each of which includes a first and second multipliers 11 and 12, which first (information) inputs in all quadrature channels 1 are united into the demodulator input. In every i-th (i=1, . . . , m) quadrature channel, the second (reference) input of the first multiplier 11.$i$ is connected to the output of a phase shifter 13.$i$ by 90°, which input is united with the second input of the second multiplier 12.$i$ into the reference input 16.$i$ of this quadrature channel 1.$i$. In the following description, the absence of subscript signs in reference numerals indicating the specific quadrature channel 1 or element thereof means that any (i-th) quadrature channel 1 is contemplated. Output of each of the first and second multipliers 11, 12 in every quadrature channel 1 is connected to the input of the first and second low-pass filters (LPF) 14, 15, respectively, which outputs are the first and second outputs 17, 18 of this quadrature channel 1, respectively.

The outputs 17, 18 of every from m quadrature channels 1 are connected to the inputs of the similarly named value in modulus calculator 2. As in the known demodulator, every value in modulus calculator 2 includes a first and second squaring units 21, 22, which inputs are the respective inputs of the value in modulus calculator 2. Outputs of both squaring units 21, 22 are connected to the inputs of summer 23, which output is connected to the input of square root extracting unit 24, which output is the output of the value in modulus calculator 2. The squaring units 21 and 22 and the square root extracting unit 24 could be made, for example, on the basis of operating amplifiers (J. Marche, Operating amplifiers and their application.—Lenongrad: Enegria, 1974.—C. 156-162).

As the known demodulator, the demodulator proposed in the present invention comprises a decision unit 3, which outputs are the respective demodulator outputs, and which implementation could be the same as in the above quasi-optimal demodulator. However, as opposed to the known demodulator, in the demodulator according to the present invention, the inputs of the decision unit 3 are connected not to the outputs of the value in modulus calculators 2, but to the second outputs 18 of all quadrature channels 1, i.e., to the outputs of all second LPF 15 of these quadrature channels 1.

Moreover, the first outputs 17 of all quadrature channels 1 are connected to the respective information inputs of the first commutator 7, and second outputs 18 of all quadrature channels 1 are connected with the respective information inputs of the second commutator 8.

The outputs of the value in modulus calculators 2 of all quadrature channels 1 are connected to the respective inputs of the maximum in modulus selection unit 5, which first output is connected to the control inputs of both commutators 7 and 8. The second output of the maximum in modulus selection unit 5 is connected to the input of the clock frequency discriminator 6.

Figure 5:
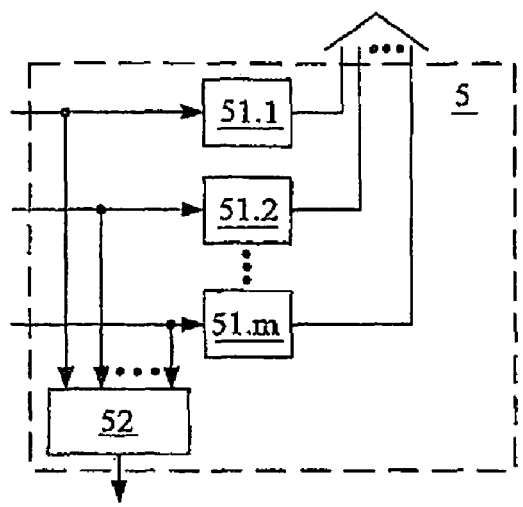
FIG. 5 is an exemplary block diagram of the maximum in modulus selection unit for the demodulator of FIG. 4.

The maximum in modulus selection unit 5 could be made, for example (FIG. 5) in the form of m threshold circuits 51, which outputs form the first output of the unit 5 intended for switching the commutators 7 and 8. The inputs of the circuits 51 are the respective inputs of the isolation circuit 52 playing the role of the element "wired OR". The output of the isolation circuit 52 being in the simplest case a resistor divider is the second output of the unit 52 intended for feeding the signal to the clock-frequency discriminator 6.

The clock-frequency discriminator 6 is, for example, a matched filter having a characteristic in the form of $$\frac{\sin x}{x}$$

tuned on the clock frequency $f_t$.

Figure 6:
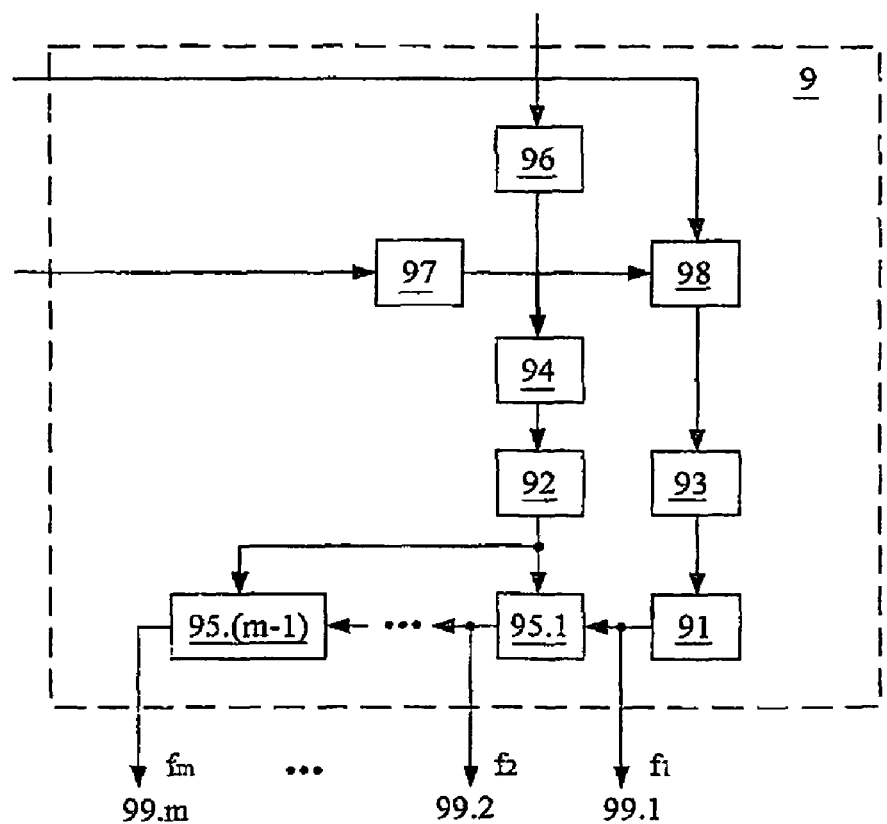
FIG. 6 is an exemplary block diagram of the frequency former for the demodulator of FIG. 4.

Moreover, the demodulator includes a frequency former 9 (FIG. 6), comprising a first and second adjustable generators 91 and 92, a first an second loop filters 93 and 94, a first to (m−1)-th frequency shift units 95, a phase detector 96, a frequency detector 97, and summer 98. The first output of the summer 98 is the first input of the frequency former 9, to which the output of the first commutator 7 is connected. The input of the frequency detector 97 being the second input of the frequency former 9 is connected to the output of the second commutator 8. The output of the frequency detector 97 is connected to the second input of the summer 98, which output is connected through the first loop filter 93 to the control input of the first adjustable generator 91. The output of the first adjustable generator 91 is connected to the signal input of the first frequency shift unit 95.1 and is the first output 99.1 of the frequency former 9. The output of every j-th (j=1, . . . , m−2) frequency shift unit 95.$j$ is connected to the signal input of the (j+1)-th frequency unit 95.(j+1) and is the (j+1)-th output 99.(j+1) of the frequency former 9, and the output of the (m−1)-th frequency shift unit 95.(m−1) is the m-th output 99.$m$ of the frequency former 9. Every one of outputs 99.$i$ of the frequency former 9 is connected to the reference input 16.$i$ of the similarly named quadrature channel 1.$i$ (where I=1, . . . , m). the first input of the phase detector 96 is the third input of the frequency former 9, to which the output of the clock-frequency discriminator 6 is connected. The output of the phase detector 96 is connected through the second loop filter 94 to the control input of the second adjustable generator 92, the output of the second adjustable generator 92 is connected to the control inputs of the first to (m−1)-th frequency shift units 95 and second input of the phase detector.

Figure 7:
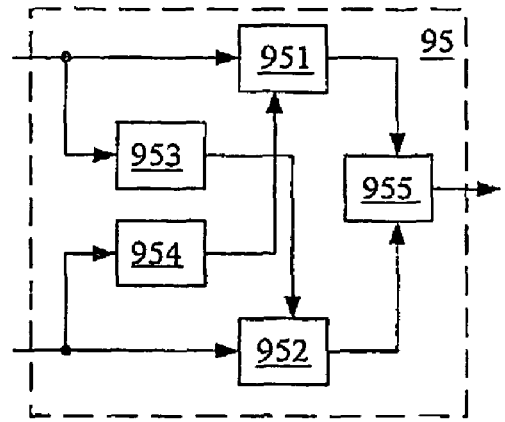
FIG. 7 is an exemplary block diagram of the frequency shift unit for the demodulator of FIG. 4.

The adjustable generators 91 and 92 could have any suitable implementation, e.g., in the form of a voltage-controlled generator (VCG). The first adjustable generator 91 generates at its output a sine signal with the frequency in proximity of the first reference frequency $f_1$, and the second adjustable generator 92 generates at its output a sine signal with the frequency approximately equal to the clock frequency $f_t$, every one of the frequency shift units 95 provides the increase of the frequency at its signal input by the value $f_t$, thus at the outputs 99 of the frequency former 9 generated are the sinusoidal signals corresponding to the frequency components of the signal being transmitted with the equidistant frequency spreading (by the value $f_t$). every one of the frequency shift units 95 could be made, for example in the form of a single sideband modulator and comprises (FIG. 7) a first and second multipliers 951 and 952, a first and second phase shifters 953 and 954 by 90°, and a subtractor 955. A cosine component of the signal with the frequency f comes to the first input of the first multiplier 951 and input of the first phase shifter 953 by 90°, which cosine component, but in the form of a sine component comes to the first input of the second multiplier 952. A sine component of the signal with the frequency $f_t$ comes to the second input of the second multiplier 952 and input of the second phase shifter 954 by 90°, which sine component, but in the form of a cosine component comes to the second input of the first multiplier 951. Signals from the multipliers 951 and 952 come to the subtracter 955, from which output the signal with the sum frequency $f+f_t$ is output. If the difference frequency $f-f_t$ should be obtained, it is necessary to include a summer instead of the subtracter 955.

The method for demodulating the signal of multiple frequency manipulation with equidistant frequency spreading according to the present invention is implemented in this demodulator (FIG. 4) as follows. Let us assume for the sake of simplicity, that k=1, i.e., the frequencies in the spectrum of the signal being transmitted are spaced apart by just the clock frequency $f_t$.

First, the frequency former 9 generates the array of frequencies $f_1, \ldots, f_m$ corresponding approximately to the equidistant spreading frequencies of the signal being transmitted. The same (equidistant) frequency spreading is ensured by that the shift of each next frequency $f_{i+1}$ in relation to the previous frequency $f_i$ is performed by the same value $f_t$. Such shift results from the operation of the second adjustable generator 92, whereas assigning the first frequency $f_1$ into the frequency array is provided by the first adjustable generator 91. However, prior to the reception beginning, the both adjustable generators 91 and 92 operate without adjustment.

When the signal being received comes to the demodulator input, in every quadrature channel 1 occurs the separation into the in-phase and quadrature components of that frequency waveform which has the frequency f close to the reference signal frequency at the reference input 16 of this quadrature channel. The separation into the in-phase and quadrature components is carried out using the multipliers 11 and 12, to which second inputs the reference signal from the reference input 16 comes in the quadrature due to the presence of the phase shifter 13 by 90°. Both quadrature components from the outputs of the multipliers 11 and 12 in a specific quadrature channel 1 are passed through the LPF 14 and 15, respectively, and are output to the outputs of this quadrature channel 1.

From the outputs of the quadrature channel 1, the filtered quadrature components with the specific frequency f come to the inputs of the similarly named value in modulus calculator 2. This value is determined by calculating the square root from the sum of squares of both quadrature components. This calculation can be made in the analog form, if the quadrature components are analog signals, or in the digital form, if the quadrature components are obtained in the form if samples of converted into the digital samples prior to feeding to the value in modulus calculator 2.

If in some time period, quadrature components appear from the output of specific quadrature channel 1.i due to the fact that in this time period a transmission on the frequency $f_i$ occurs, at the output of the similarly named value in modulus calculator 2.i appears a signal, which value will be much greater than values at the outputs of all others value in modulus calculators 2. When the frequency of the signal being received changes (FIG. 1), such a value exceeding all others will appear at the output of another value in modulus calculator 2. The maximum in modulus selection unit 5 forms at its first output a signal providing a switching of the commutators 7 and 8 in accordance with what one from the value in modulus calculator 2 has formed the maximum signal in this period. This switching occurs with the clock frequency $f_t$. At the second output of the maximum in modulus selection unit 5 is formed a signal repeating with the clock frequency $f_t$. The clock-frequency discriminator 6 outputs the filtered signal with the frequency exactly equal to the clock frequency $f_t$, with which the signal being received was formed at the transmitting side.

The extracted signal with the clock frequency $f_t$ comes to one of inputs of the phase detector 96, at which another input is fed a signal from the second adjustable generator 92. The signal from the output of the phase detector 96 corresponding to the phase mismatch between the signals at the inputs of the phase detector 96 is filtered by the second loop filter 94 and is fed to the control input of the second adjustable generator 92. In the case of the exact equality of the signal phases at the inputs of the phase detector 96, the adjustment of the second adjustable generator 92 is ceased.

At the same time, from the outputs of every one of the quadrature channels 1, the sine components being a signal of beats between the frequency of the signal being received and the reference frequency of this quadrature channel 1 come to the inputs of the first commutator 7, and cosine components come to the inputs of the second commutator 8. When the frequency of the signal being received changes, such beats will appear at the output of another quadrature channel 1. Both commutators 7 and 8 are switched with the same signal from the maximum in modulus selection unit 5, therefore to the outputs of the commutators 7 and 8 will come signals only from that quadrature channel 1, where the maximum signal takes place, i.e., from that quadrature channel 1.i, which receives the signal with the frequency $f_t$ at that time. The resulting signal at the output of the commutator 7 will be the beat signal composed from the pieces from outputs of every quadrature channel 1.

The frequency detector 97 and summer 98 form the frequency-phase detector. The frequency detector 97 carries out the detection of the signal from the output of the second commutator 8. The signal from the frequency detector 97 is summed with the beat signal from the first commutator 7 and fed through the first loop filter 93 to the control input of the first adjustable generator 91. When the signal frequency at the output of the first adjustable generator 91, i.e., at the first output 99.1 of the frequency former 9, is equal exactly to the frequency $f_1$ in the array of equidistant frequencies of the signal being received, the adjustment of the first adjustable generator 91 is terminated. In this case, all frequencies at the outputs 99 of the frequency former 9 become coherent to the respective frequencies of the signal being received. The beats at the output of the first commutator 7 become zero, and the constant component from the output of the second commutator 8 does not change the tunings of the first adjustable generator 91.

Hence, the coherent reception of the incoming signal is provided in the demodulator according to the present invention. Therefore, the decision unit 3, which outputs are connected to the outputs of only the in-phase component in every quadrature channel 1, makes the decision as in the known quasi-optimal demodulator (FIG. 3). However, since in this case the quadrature components deteriorating, as mentioned above, the threshold signal-to-noise ratio by 3 dB are not used, this threshold S/N ratio in the demodulator according to the present invention is practically corresponds to the optimal one.

For those skilled in the art it could be appreciate that the above condition k=1 was introduced for only simplifying the explanation. In the case, when k>1, the operation of the demodulator according to the present invention will be carried out in the same way except for that the frequency shift units 95 will provide the frequency change by the value of $kf_t$ rather than $f_t$.

For those skilled in the art it could be appreciate that the demodulator according to the present invention can be implemented not only in a hardware form but also in a software form. In this case, the received signal should in advance be sampled, digitized, and transferred to the bit sample form. These samples will be processed in the computer processor in accordance with the program which algorithm was in fact described above. Then the program, corresponding to the implementation of the above functioning algorithm, by which program implementation in the computer it is possible to implement the method according to the present invention, could be recorded to the computer-readable medium intended for the direct operation as a part of the computer.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for demodulating a signal of multiple frequency manipulation with equidistant frequency spreading, comprising:
    forming an array of adjustable frequencies from $f_1$ to $f_m$ for exact adjusting of said frequency spreading, where m is a maximum number of the frequencies in the signal of multiple frequency manipulation with equidistant frequency spreading $f_p=kf_t$, where $f_t$ is a clock frequency, k=1, 2, . . . an initial frequency values in the array being allocated in such regions, where exact values of a frequency of a received signal could be situated;
    demodulating the received signal using the array;
    while receiving the received signal, extracting maximum values in modulus of the received signal on all frequencies $f_i$(i=1, . . . , m) switched with the clock frequency $f_t$ to obtain switched maximum values;
    extracting the clock frequency $f_t$ from the switched maximum values of the received signal for exact adjusting the frequency spreading $f_p$ to the clock frequency $f_t$;
    tuning the array of adjustable frequencies with the frequency spreading adjusted to the exact values of the received signal frequency;
    wherein demodulating the received signal occurs by coherently receiving the received signal using only one of the quadrature channels for ascertaining the presence or absence of a signal of a particular frequency from said exact frequency values.

2. The method according to claim 1, wherein for extracting the maximum values in the modulus of the received signal, the amplitude value of every one of quadrature components of any frequency is squared, squared amplitude values in every pair of the quadrature components of one frequency are summed, and a square root is taken of every determined sum.

3. The method according to claim 1, wherein the step of adjusting the frequency spreading $f_p$ to the clock frequency $f_t$ performed using a first frequency phase-locked-loop.

4. The method according to claim 3, wherein tuning the array of the adjustable frequencies with the frequency spreading adjusted to the exact values of the received signal frequency is performed using a second frequency phase-locked-loop.

5. A demodulator for a signal of multiple frequency manipulation with equidistant frequency spreading, comprising:
    m quadrature channels, wherein m is a maximum number of quadrature frequencies, in the signal of multiple frequency manipulation with the equidistant frequency spreading;
    a frequency former, wherein each of m outputs is connected to a reference input of a respective quadrature channel;
    a decision unit for making a decision on the presence or absence of a signal with a particular frequency in the signal of multiple frequency manipulation, wherein outputs of said decision unit are demodulator outputs;
    m modulus calculators, which information inputs are the united input of the demodulator;
    a maximum in modulus selection unit, which every input being connected to the output of respective value in modulus calculator;
    a first and second commutators, which control inputs are connected to the first output of said maximum in modulus selection unit, and which outputs are connected to the first and second inputs of said frequency former;
    a clock-frequency discriminator, which input is connected to the second output of said maximum in modulus selection unit, and which output is connected to the third input of said frequency former;
    the first output of each quadrature channel is connected to the first input of the respective value in modulus calculator and respective information input of the first commutator;
    the second output of each quadrature channel is connected to the second input of the respective value in modulus calculator, respective information input of the second commutator, and respective input of the decision unit;
    said frequency former being configured for forming an array of m frequencies adjusted according to the output signals from said commutators, with the equidistant frequency spreading adjusted according to the output signal of said clock frequency discriminator, the first to m-th outputs of the frequency former being connected to the reference inputs of the first to m-th quadrature channels, respectively.

6. The demodulator according to claim 5, characterized in that each quadrature channel comprises a first and second multipliers, which outputs are connected to the inputs of the first and second low-frequency filters, which outputs are the first and second outputs of the quadrature channel, respectively, the inputs of the first and second multipliers are united and is the information input of the quadrature channel, the second input of the first multiplier is connected with the output of phase shifter by 90°, which input is united with the second input of the second multiplier and is the reference input of the quadrature channel.

7. The demodulator according to claim 5, characterized in that the value in modulus calculator comprises a first and second squaring units, summer and square root extracting unit, which output is the calculator output, the inputs of the first and second squaring units are the first and second calculator inputs, respectively, the outputs of both squaring units are connected to the inputs of the summer, which output is connected to the input of the square root extracting unit.

8. The demodulator according to claim 5, characterized in that the frequency former comprises a first and second adjustable generators, a first and second loop filters, a first to (m−1)-th frequency shift units, phase detector, frequency detector, and summer, which first input is the first input of the frequency former and the output is connected through the first loop filter to the control input of the first adjustable generator, which output is connected to the signal input of the first frequency shift unit and is the first output of the frequency former, the output of each j-th (j=1, . . . , m−2) frequency shift unit is connected to the signal input of the (j+1)-th frequency shift unit and is the (j+1)-th output of the frequency former, the output of the (m−1)-th frequency shift unit is the m-th output of the frequency former, the input of the frequency detector is connected to the second input of the summer, the first input of the phase detector is the third input of the frequency former, the output of the phase detector is connected through the second loop filter to the control input of the second adjustable generator, which output is connected to the control inputs of the first to (m−1)-th frequency shift units and second input of the phase detector.

9. The demodulator according to claim 8, characterized in that the frequency shift unit is implemented in the form of single-sideband modulator.

10. A non-transitory computer-readable medium intended for the direct operation as a part of a computer and comprising a program for implementing the method according to claim 1.

* * * * *